United States Patent
Masuda

(10) Patent No.: US 6,827,251 B2
(45) Date of Patent: Dec. 7, 2004

(54) METHOD FOR JOINING

(75) Inventor: Takashi Masuda, Tokyo (JP)

(73) Assignee: Yamatake Corporation, Tokyo (JP)

( * ) Notice: Subject to any disclaimer, the term of this patent is extended or adjusted under 35 U.S.C. 154(b) by 4 days.

(21) Appl. No.: 10/381,821

(22) PCT Filed: Oct. 1, 2001

(86) PCT No.: PCT/JP01/08645

§ 371 (c)(1),
(2), (4) Date: Aug. 1, 2003

(87) PCT Pub. No.: WO02/26660

PCT Pub. Date: Apr. 4, 2002

(65) Prior Publication Data

US 2004/0040654 A1 Mar. 4, 2004

(30) Foreign Application Priority Data

Sep. 29, 2000 (JP) .................................... 2000-298152

(51) Int. Cl.$^7$ ............................. B23K 1/00; B23K 31/00
(52) U.S. Cl. ...................................... 228/121; 228/254
(58) Field of Search ........................... 228/121, 245–262

(56) References Cited

U.S. PATENT DOCUMENTS

| | | | | |
|---|---|---|---|---|
| 3,615,282 A | * | 10/1971 | Eichelman et al. | ......... 428/637 |
| 5,038,996 A | * | 8/1991 | Wilcox et al. | ............... 228/121 |
| 5,305,945 A | * | 4/1994 | Cottone et al. | .............. 228/183 |
| 5,389,224 A | * | 2/1995 | Hetrick | ........................ 204/425 |
| 5,392,982 A | * | 2/1995 | Li | ............................ 228/124.5 |
| 6,200,445 B1 | * | 3/2001 | Yokota et al. | ............... 204/424 |
| 6,254,749 B1 | * | 7/2001 | Yokota et al. | ............... 204/424 |
| 6,422,451 B2 | * | 7/2002 | Bendall et al. | ............. 228/199 |
| 2002/0093046 A1 | * | 7/2002 | Moriya et al. | ............... 257/315 |
| 2004/0007071 A1 | * | 1/2004 | Masuda | ....................... 73/700 |
| 2004/0026485 A1 | * | 2/2004 | Masuda | ....................... 228/203 |
| 2004/0040654 A1 | * | 3/2004 | Masuda | .................. 156/308.6 |

FOREIGN PATENT DOCUMENTS

| | | | |
|---|---|---|---|
| EP | 1327617 A1 | * | 7/2003 |
| EP | 1329960 A1 | * | 7/2003 |
| JP | 55-162485 A | | 12/1980 |
| JP | 58-069784 A | | 4/1983 |
| JP | 61-014179 A | | 1/1986 |
| JP | 61-014180 A | | 1/1986 |
| JP | 03-215370 A | | 9/1991 |
| JP | 2002105765 A | * | 4/2002 |

* cited by examiner

Primary Examiner—Kiley Stoner
(74) Attorney, Agent, or Firm—Blakely Sokoloff Taylor & Zafman

(57) ABSTRACT

A substrate (101) is coated with an aqueous solution of boehmite (AlO(OH)) which is an aluminum hydroxide to form a coating film (102), and the property of the coating film (102) is modified into α-alumina, thereby joining the substrate (101) to a substrate (103).

9 Claims, 2 Drawing Sheets

ND FOR JOINING

The present patent application is a non-provisional application of International No. PCT/JP01/08645, filed Oct. 1, 2001.

BACKGROUND ART

The present invention relates to a method for joining a member made of a metallic oxide such as sapphire to another member.

A crystal of a metallic oxide such as zirconia ($ZnO_2$) or α-phase aluminum oxide such as sapphire has good mechanical properties, heat resistance, and corrosion resistance and is used as a member of various types of devices. For example, a pressure sensor having a housing and the like made of sapphire is proposed. This pressure sensor is a capacitive pressure sensor which detects a pressure by detecting an electrostatic capacitance and has a housing comprised of a base with a predetermined space and a diaphragm arranged above the space of the base, a stationary electrode arranged in the base, and a movable electrode fixed to the diaphragm. The base and diaphragm are made of sapphire.

Sapphire, i.e., a corundum (α-phase aluminum oxide) has high thermal stability and can hardly dissolve in acid and alkaline solutions, so that it is widely used as a refractory material, insulator, abrasive, and the like. By using a member with the properties described above for the housing, even when an object to be measured is a corrosive fluid, the above-described pressure sensor can measure the pressure of the fluid by directly receiving it at the diaphragm.

The above-described pressure sensor chip is used as a pressure sensor by fixing to a pedestal, as shown in FIG. 7. As shown in FIG. 7, a pressure sensor chip 701 is placed in a recess 703 formed at a central portion of a pedestal 702 made of, e.g., glass to face a diaphragm portion upward in FIG. 7. Terminals 705 of electrode pins 704 extending through the bottom surface of the pedestal 702 are formed on the bottom surface of the recess 703 of the pedestal 702, which are respectively connected to the wires of electrodes led to the lower surface of the base of the chip 701. A vent port 706 communicating the bottom surface of the pedestal 702 is formed in the bottom surface of the recess 703.

A cover plate 707 having an opening portion at the central portion presses the periphery of the upper surface of the chip 701, thereby fixing it to the recess 703. The cover plate 707 is joined to the upper surface of the pedestal 702 by using glass melted once and fixed to the pedestal 702. The cover plate 707 and chip 701 are airtightly sealed with each other such that no fluid to be measured brought into contact with the upper surface of the chip 701 enters the recess 703 around the chip 701.

To ensure pressure measurement accuracy, the cover plate 707 is made of sapphire which is the same material as that of the chip 701 to obtain the same degree of deformation, due to temperatures, as that of the chip 701, such that no stress acts on the chip 701. To airtightly seal the chip as described above by excluding dissimilar metal joint as much as possible, the abutting surfaces of the cover plate 707 and chip 701 are directly joined. To join the two members made of sapphire as described above, their joint surfaces are mirror-polished and abutted, and the two sapphire materials to be joined are heated while applying a pressure therebetween, thereby joining them strongly without using an adhesive or the like.

In the above-described direct joining, however, since the abutting surfaces of the two sapphire members must be mirror-polished to a roughness of 0.3 nm or less, the expensive member (cover plate) is required. When a general adhesive is used, no joint surfaces must be mirror-polished. However, since a different material is interposed between the two members, a stress occurs, and the same corrosion resistance and thermal stability as in sapphire are not obtained at the joint portion. This restricts the application range.

As described above, when two or more members made of a metallic oxide are to be conventionally joined to form a component, the members are directly joined to take full advantage of the material properties of the members, but direct joining increases a cost. In contrast, when the two members are joined by using an adhesive or the like, the component is formed at a low cost, but the full advantage of the material properties of the member is not taken.

DISCLOSURE OF INVENTION

The present invention has been made to solve the above problem, and has as its object to allow to join members made of a metallic oxide such as sapphire at a low cost without degrading the properties of the members.

In a method for joining according to an aspect of the present invention, a solution layer formed from a solution in which a compound containing a metal and oxygen of a metallic oxide is dissolved is formed on a joint surface of a base made of the metallic oxide, the solution layer is heated to form, on the joint surface of the base, an adhesion layer containing the metal and oxygen in an intermediate phase state which is unstabler than the metallic oxide and in which an energy level tends to change into a lower level, another member is arranged on the adhesion layer, and a pressure is applied between the base and another member while heating the adhesion layer to cause phase transition of the adhesion layer in the intermediate phase state to the metallic oxide with a stabler phase than that of the adhesion layer, thereby joining the base to another member.

According to this method for joining, the base and another member are joined without any material other than the material of the base therebetween.

In the method for joining described above, when the adhesion layer is heated while applying a pressure between the base and another member, an electric field may be simultaneously applied to the adhesion layer to promote, e.g., oxygen ion diffusion to promote phase transition.

In the method for joining described above, the metallic oxide is α-phase aluminum oxide, and the adhesion layer is made of aluminum oxide with a phase other than an α phase.

In the method for joining described above, the compound containing the metal and oxygen is a salt containing the metal and an acid, an organometallic compound, or a hydroxide of the metal. In addition, the compound containing the metal and oxygen is boehmite. Further, the aluminum oxide with a phase other than the α phase is one material selected from the group consisting of γ-, θ-, ι-, κ-, ε-, χ-, δ-, and σ-phase aluminum oxides or a compound thereof.

BEST MODE FOR CARRYING OUT THE INVENTION

Embodiments of the present invention will be described below with reference to the accompanying drawings.

First Embodiment

Figure 1:
FIG. 1 is a view showing a course in a method for joining according to an embodiment of the present invention.

FIG. 1 is a view for explaining a method for joining according to an embodiment of the present invention. A case wherein sapphire substrates are joined to each other will be exemplified here.

As shown in FIG. 1, a sapphire substrate 101 is coated with an aqueous solution of boehmite (AlO(OH)) which is an aluminum hydroxide to form a coating film 102. When a small amount of nitric acid is added to the coating solution to set its hydrogen ion concentration (pH) to about 4, a stable dissolving state can be obtained even if boehmite has a high concentration.

Figure 2:
FIG. 2 is a view showing a course in the method for joining according to the embodiment following FIG. 1.

The substrate 101 with the coating film 102 is heated to, e.g., 450° C. The water content is evaporated by heating, and the coating film made of the aqueous solution of boehmite is changed into a gel film. When the boehmite gel on the substrate 101 is further heated, it changes into $\gamma$-phase aluminum oxide ($\gamma$-alumina) by dehydration and joins to the sapphire substrate 101. As a result, as shown in FIG. 2, an intermediate product layer (adhesion layer) 102a made of $\gamma$-alumina or amorphous alumina is formed in the joint region on the surface of the substrate 101 while joining thereto. Since the intermediate product layer 201a is formed by applying the aqueous solution of boehmite, the surface of the intermediate product layer 201a absorbs unevenness on the surface of the substrate 101 to make it flat. This flat state allows direct joining when the intermediate product layer 201a is made of sapphire.

In a corundum crystal structure ($\alpha$ phase), alumina has a very stable state as a corundum such as sapphire. In contrast, a cubic spinel crystal structure of $\gamma$-alumina has a large number of lattice defects generated by oxygen atom omissions due to an unnatural crystal structure. That is, $\gamma$-alumina is unstable as compared with $\alpha$-alumina, and is in an intermediate phase state in which an energy level tends to change into a lower level. In addition, amorphous alumina has a larger number of lattice defects than that of $\gamma$-alumina. When a layer having the large number of lattice defects generated by oxygen atom omissions is formed on sapphire, oxygen contained in sapphire on the surface of sapphire enters each lattice defect to attain a stable state. With this reaction, the sapphire substrate 101 and the intermediate product layer 201a formed on the surface of the substrate 101 are chemically bonded and joined.

Figure 3:
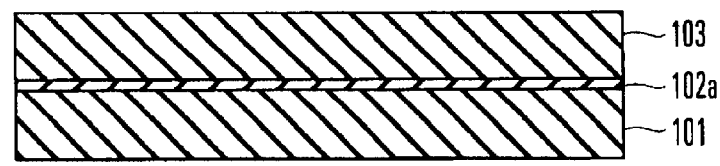
FIG. 3 a view showing a course in the method for joining according to the embodiment following FIG. 2.

Subsequently, a sapphire substrate 103 is prepared as another member, and the surface of the intermediate product layer 102a on the substrate 101 abuts against the surface of the substrate 103, as shown in FIG. 3. In this state, a pressure of, e.g., 100 to 30,000 Pa and preferably 2,000 Pa is applied between the substrates 101 and 103, and they are heated to about 1,000° C. With this compression, a load is applied to the substrates 101 and 103 to prevent them from warping, thereby entirely contacting the join regions of the substrate 101 (intermediate product layer 102a) with substrate 103. These processes are performed in a reduced-pressure atmosphere.

With the above operation, $\gamma$-alumina of the intermediate product layer 102a undergoes phase transition to $\alpha$-phase aluminum oxide ($\alpha$-alumina) through $\sigma$-alumina$\rightarrow\theta$-alumina by heating.

Figure 4:
FIG. 4 a view showing a course in the method for joining according to the embodiment following FIG. 3.

As a result, the intermediate product layer 102a changes into a crystal layer 104 made of $\alpha$-alumina, and the boundaries between the layer and substrates finally disappear, thereby joining the substrates 101 and 103 through the crystal layer 104 with a contiguous $\alpha$-alumina state (FIG. 4). Since the crystal layer 104 has changed into $\alpha$-alumina or sapphire, the substrates 101 and 103 are seamlessly and strongly joined, to the same joining degree as in direct joining, by the crystal layer 104 made of sapphire which is the same material as in the substrates.

In this embodiment, the joint surface roughness of each of substrates 101 and 103 is set to about, e.g., 10 nm as long as, in forming the intermediate product layer by applying the solution, the surface of the intermediate product layer absorbs the surface roughness of each substrate to make it flat. A substrate with a surface roughness of about 10 nm has been used for, e.g., a wristwatch window, and is as inexpensive as several hundred yen in this size. A substrate with the same size as described above and a surface roughness of 0.3 nm or less, which is processed for direct joining, is several ten thousand yen. In this manner, according to this embodiment, the substrates can be joined to the same joining degree as in direct joining while eliminating the highly accurate process which increases the cost.

Second Embodiment

Another embodiment according to the present invention will be described next.

Figure 5:
FIG. 5 a view showing a course in a method for joining according to another embodiment of the present invention.
Figure 6:
FIG. 6 a view showing a course in a method for joining according to still another embodiment of the present invention.
Figure 7:
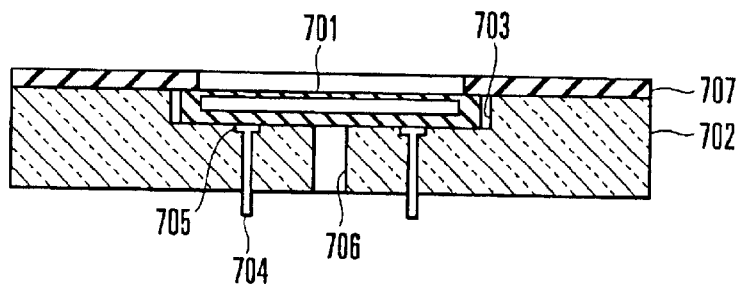
FIG. 7 a sectional view showing the structure of a pressure sensor manufactured by a conventional method for joining.

In this embodiment, $\gamma$-alumina is formed from an aqueous solution of aluminum nitrate. As shown in FIG. 5, first, a substrate 101 is coated with an aqueous solution of aluminum nitrate to form a film 502. When the substrate 101 with the film 502 is heated, the water content of the film 502 is evaporated, and the aluminum nitrate in the film 502 is then decomposed into a basic salt by losing nitric acid and finally changes into $\gamma$-alumina. As a result, as shown in FIG. 2, an intermediate product layer 201a made of $\gamma$-alumina is formed on the substrate 101.

This state is the same as in the above-described embodiment. In the following operation, like the above-described embodiment, a sapphire substrate 103 is prepared as another member, and the surface of the intermediate product layer 102a on the substrate 101 abuts against the surface of the substrate 103, as shown in FIG. 3. In this state, a pressure of about 2,000 Pa is applied between the substrates 101 and 103, and they are heated to about 1,000° C.

With this operation, in this embodiment as well, the substrates 101 and 103 are seamlessly and strongly joined, to the same joining degree as in direct joining, by the crystal layer 104 made of sapphire which is the same material as in the substrates, as shown in FIG. 4.

In this embodiment, the substrate is coated with the aqueous solution of aluminum nitrate. However, an aqueous solution of a strong acid or strong alkali may be applied to a substrate and heated to cause a chemical reaction in sapphire itself on the surface of the substrate, thereby forming an aluminum nitrate layer on the surface of the substrate.

Third Embodiment

Still another embodiment according to the present invention will be described next.

In this embodiment, an organometallic compound of aluminum is heated to about 200 to 600° C. to form an intermediate product layer. As the organometallic compound of aluminum, ethyl acetoacetate aluminum diisopropylate, aluminum isopropylate, or the like is used.

When an organometallic compound of aluminum is to be used, first, a substrate 101 is coated with the organic solvent solution of an organometallic compound of aluminum to form an organic film 602.

When the substrate 101 with the organic film 602 is heated, the organic solvent of the organic film 602 is evaporated. Thereafter, when the substrate 101 with the organic film 602 is heated to the temperature described above, the organometallic compound decomposes to vaporize an organic component, so that amorphous aluminum oxide or γ-phase aluminum oxide remains. This decomposition can be executed at a lower temperature by irradiating the film with ultraviolet rays or by performing decomposition in an oxygen plasma. As a result, an intermediate product layer 102a made of intermediate phase alumina such as amorphous alumina or γ-alumina is formed on the substrate 101, as shown in FIG. 2 like the above-described embodiment.

This state is the same as in the above-described embodiment. In the following operation, like the above-described embodiment, a sapphire substrate 103 is prepared as another member, and the surface of the intermediate product layer 102a on the substrate 101 abuts against the surface of the substrate 103, as shown in FIG. 3. In this state, a pressure of about 2,000 Pa is applied between the substrates 101 and 103, and they are heated to about 1,000° C.

With this operation, in this embodiment as well, the substrates 101 and 103 are seamlessly and strongly joined, to the same joining degree as in direct joining, by the crystal layer 104 made of sapphire which is the same material as in the substrates, as shown in FIG. 4.

In this embodiment, the sapphire substrates are bonded by forming the intermediate product layer, and then they are heated to about 1,000° C., resulting in phase transition. However, an electric field is applied to the intermediate product layer while heating the intermediate product layer to promote oxygen ion diffusion, so that phase transition to an α phase can be made at a lower temperature.

Note that this embodiment exemplifies sapphire as a metallic oxide, but the present invention is not limited to this. For example, zirconia ($ZnO_2$) is used to obtain the same result as described above.

As described above, according to the embodiment described above, a member made of α-phase aluminum oxide such as sapphire can be joined to another member to the same joining degree as in direct joining. This allows to joint them at a low cost without degrading the material properties.

As has been described above, a method for joining according to the present invention is suited to a case wherein a member made of α-phase aluminum oxide such as sapphire is joined to another member to the same joining degree as in direct joining at a low cost without degrading the material properties.

What is claimed is:

1. A method for joining characterized by comprising:
   the first step of forming, on a joint surface of a base made of a metallic oxide, a solution layer formed from a solution in which a compound containing a metal and oxygen of the metallic oxide is dissolved;
   the second step of heating the solution layer to form, on the joint surface of the base, an adhesion layer containing the metal and oxygen in an intermediate phase state which is unstabler than the metallic oxide and in which an energy level tends to change into a lower level; and
   the third step of arranging another member on the adhesion layer, and applying a pressure between the base and said another member while heating the adhesion layer to cause phase transition of the adhesion layer in the intermediate phase state to the metallic oxide with a stabler phase than that of the adhesion layer, thereby joining the base to said another member.

2. A method for joining according to claim 1, characterized in that
   in the third step, an electric field is applied to the adhesion layer while heating the adhesion layer.

3. A method for joining according to claim 1, characterized in that
   the metallic oxide includes α-phase aluminum oxide, and the adhesion layer is made of aluminum oxide with a phase other than an a phase.

4. A method for joining according to claim 1, characterized in that
   the compound containing the metal and oxygen includes a salt containing the metal and an acid.

5. A method for joining according to claim 1, characterized in that
   the compound containing the metal and oxygen includes an organometallic compound.

6. A method for joining according to claim 1, characterized in that
   the compound containing the metal and oxygen includes a hydroxide of the metal.

7. A method for joining according to claim 3, characterized in that
   the metallic oxide includes sapphire.

8. A method for joining according to claim 3, characterized in that
   the compound containing the metal and oxygen includes boehmite.

9. A method for joining according to claim 3, characterized in that
   the aluminum oxide with a phase other than the α phase is one material selected from the group consisting of γ-, θ-, ι-, κ-, ε-, χ-, δ-, and σ-phase aluminum oxides or a compound thereof.

* * * * *